United States Patent
Johnson et al.

(10) Patent No.: US 11,977,900 B2
(45) Date of Patent: May 7, 2024

(54) DYNAMIC TIMING FOR SHUTDOWN INCLUDING ASYNCHRONOUS DYNAMIC RANDOM ACCESS MEMORY REFRESH (ADR) DUE TO AC UNDERVOLTAGE

(71) Applicant: HEWLETT PACKARD ENTERPRISE DEVELOPMENT LP, Houston, TX (US)

(72) Inventors: Jared Johnson, Chippewa Falls, WI (US); Robert Mascia, Chippewa Falls, WI (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 170 days.

(21) Appl. No.: 17/316,352

(22) Filed: May 10, 2021

(65) Prior Publication Data
US 2022/0357956 A1  Nov. 10, 2022

(51) Int. Cl.
G06F 9/4401 (2018.01)
G01R 19/165 (2006.01)
G06F 1/28 (2006.01)
G06F 11/30 (2006.01)
G06F 11/34 (2006.01)
G11C 11/406 (2006.01)
H02H 3/247 (2006.01)

(52) U.S. Cl.
CPC ......... *G06F 9/442* (2013.01); *G01R 19/1658* (2013.01); *G06F 1/28* (2013.01); *G06F 11/3058* (2013.01); *G06F 11/3495* (2013.01); *G11C 11/406* (2013.01); *H02H 3/247* (2013.01)

(58) Field of Classification Search
CPC ........ G06F 9/442; G06F 1/28; G06F 11/3058; G06F 11/3495; G06F 1/305; G01R 19/1658; G11C 11/406; G11C 11/4074; H02H 3/247
See application file for complete search history.

(56) References Cited

U.S. PATENT DOCUMENTS

| | | | |
|---|---|---|---|
| 9,721,660 B2 | 8/2017 | Kelly et al. | |
| 10,025,714 B2 | 7/2018 | Han et al. | |
| 10,599,503 B2 | 3/2020 | Rahmanian et al. | |
| 10,606,716 B2 | 3/2020 | Du et al. | |

(Continued)

OTHER PUBLICATIONS

Ueno, F. et al., "Emergency Power Supply for Small Computer Systems," International Sympoisum on Circuits and Systems, Jun. 11, 1991, pp. 1065-1068, https://ieeexplore.ieee.org/document/176549.

(Continued)

*Primary Examiner* — Jaweed A Abbaszadeh
*Assistant Examiner* — Brian J Corcoran
(74) *Attorney, Agent, or Firm* — Nolte Lackenbach Siegel

(57) ABSTRACT

A technique for managing undervoltage in a compute system is disclosed. The technique includes a method that further includes: detecting an AC undervoltage condition in the compute system; and upon detecting the AC undervoltage condition: dynamically determining a holdup time as a function of the present load; determining a monitoring period as a function of the dynamically determined holdup time; waiting for the determined monitoring period to expire; and upon expiration of the determined monitoring period, perform a shutdown process if the AC undervoltage condition persists.

17 Claims, 5 Drawing Sheets

(56) References Cited

U.S. PATENT DOCUMENTS

| | | | |
|---|---|---|---|
| 10,872,018 B2 | 12/2020 | Peng et al. | |
| 2010/0332873 A1* | 12/2010 | Munjal | G06F 1/3203 |
| | | | 713/320 |
| 2014/0331070 A1* | 11/2014 | Du | H02J 9/061 |
| | | | 713/340 |
| 2017/0031402 A1* | 2/2017 | Muccini | G06F 1/329 |
| 2017/0168535 A1* | 6/2017 | Ragupathi | G06F 1/28 |
| 2018/0011714 A1 | 1/2018 | Han et al. | |
| 2018/0356876 A1* | 12/2018 | Gharpure | H02M 1/4208 |
| 2021/0064490 A1* | 3/2021 | Dong | G06F 1/3206 |
| 2022/0318154 A1* | 10/2022 | Fuller | G06F 12/0868 |

OTHER PUBLICATIONS

SNIA, "NVDIMM Messaging and FAQ", AgigA Tech, Jan. 2014, 10 pages.
TN0024 Technical Note, "Power supply HOLD-UP Time", STMicroelectronics, 2007, pp. 1-11.

* cited by examiner

DYNAMIC TIMING FOR SHUTDOWN INCLUDING ASYNCHRONOUS DYNAMIC RANDOM ACCESS MEMORY REFRESH (ADR) DUE TO AC UNDERVOLTAGE

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND

This section of this document introduces information about and/or from the art that may provide context for or be related to the subject matter described herein and/or claimed below. It provides background information to facilitate a better understanding of the various aspects of the present invention. This is a discussion of "related" art. That such art is related in no way implies that it is also "prior" art. The related art may or may not be prior art. The discussion in this section of this document is to be read in this light, and not as admissions of prior art.

Compute systems frequently use "volatile memory" and "non-volatile memory". Volatile memory loses its content when power is lost, whether due to shutdown or failure. This type of memory is typically used to temporarily hold information while the compute system is executing programmed operations. Non-volatile memory retains its contents even when power is lost. Non-volatile memory, sometimes called "persistent memory", is generally used for longer term storage.

Compute systems with non-volatile memory perform a process called asynchronous dynamic random access memory ("DRAM") refresh ("ADR") prior to shutdown. The ADR process transfers contents from volatile memory to non-volatile memory. This process may also transfer content from within an application specific integrated circuit ("ASIC") and/or any other part of the compute system as well.

Compute systems frequently use non-volatile, dual in-line memory modules ("NVDIMMs") to implement both volatile and non-volatile memory. In these compute systems, the ADR process transfers the content of a volatile memory of an NVDIMM to a non-volatile memory of the NVDIMM. The process of transferring content from the volatile memory to the non-volatile memory in a controlled shutdown takes a finite amount of time that is a factor in a controlled shutdown.

BRIEF DESCRIPTION OF THE DRAWINGS

The invention may be understood by reference to the following description taken in conjunction with the accompanying drawings, in which like reference numerals identify like elements, and in which.

Figure 1:
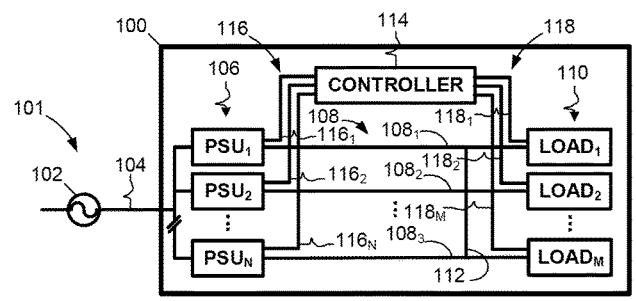
FIG. 1 schematically depicts selected portions an example compute system in accordance with one or more embodiments.

While the invention is susceptible to various modifications and alternative forms, the drawings illustrate specific embodiments herein described in detail by way of example. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Illustrative embodiments of the subject matter claimed below will now be disclosed. In the interest of clarity, not all features of an actual implementation are described in this specification. It will be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

A controlled shutdown during which ADR is performed implicates the operation of the power supply units ("PSUs") of the power subsystem because of the need for power to perform the ADR. For example, in previous generations of compute systems that support ADR, the ADR process has taken less than 2 ms to complete. It was therefore desirable for the compute system to maintain power at least 2 ms before shutdown so that the ADR process can be performed. This 2 ms is sometimes called a "hold-up time". More precisely, the "hold-up time" is the duration in which there is no input power, but the power subsystem is still providing adequate output power to support all standard system functions.

The power subsystems of compute systems usually monitor whether the PSUs are receiving adequate alternating current ("AC") power from, for instance, the electrical grid or a backup generator. The power subsystems also monitor the PSUs output of direct current ("DC") power. If either input AC power or output DC power are "out of regulation", signals are sent alerting other portions of the compute system of irregularities that might elicit a response. For example, the compute system might initiate an ADR process.

Compute systems complying with the Common Redundant Power Supply ("CRPS") standard include PSUs that generate a "PowerOK" signal indicating that output DC power is within regulation. The PSU may "assert" the PowerOK signal by outputting a "1" or a "high" value when input AC power is within regulation. Conversely, the PSU may "de-assert" the PowerOK signal by outputting a "0" or a "low" value. Upon detecting that the PowerOK signal has been de-asserted, the compute system may perform an ADR in anticipation of a shutdown.

The 2 ms hold-up time for the ADR was achievable in these compute systems by de-asserting the PowerOK signal at least 2 ms before the main DC output power was out of regulation (e.g., 90% voltage level). The PowerOK signal referenced an internal bulk capacitor voltage level to determine when the DC power output would be out of regulation. The PowerOK signal could then be de-asserted to indicate out of regulation power input in time for the ADR to be performed.

However, compute systems continue to grow in terms of size and power consumption. For the size of future compute systems being planned to be supported, it is estimated to require at least 6 ms of hold-up by the power supplies in order to properly execute the ADR process to shut down without loss in data. Conventional approaches that maintain 2 ms hold-up times may be inadequate to support the new 6 ms hold-up times.

One approach would be to monitor the input AC power. Again, in compute systems complying with the CRPS standard, the power subsystem monitors the input AC power and asserts a VIN_GOOD signal to indicate that input AC power is within regulation. Conversely, if the input AC power falls out of regulation (e.g., external power failure), the VIN_GOOD signal is de-asserted. The system could simply react immediately after knowing that input power has been lost via the VIN_GOOD signal, however this would lead to unnecessary shutdown if power were to be restored within a period of time that the power supply could have ridden through due to the amount of charge still in the capacitors, as once the ADR process is initiated the system cannot recover.

The present disclosure describes a dynamic timing technique allowing a compute system to react to AC input power or other under-voltage condition and react with shutdown processes after a maximum hold-up time has elapsed. For purposes of this disclosure, an under-voltage condition includes an interruption or other loss of AC input power and the shutdown processes may include an ADR. An AC undervoltage condition may be a loss of input power, or an input power outside of regulation, or a loss of redundant power supply, or a combination thereof.

This technique references information provided by the system power supply units that will detect when there is an under-voltage condition on the AC power input of the power supply units and/or on the DC power output load level the power supplies are providing. The DC power output load level can then be used dynamically to determine hold-up time the power supplies can provide at the known load level. The dynamically determined hold-up time tells the system a maximum hold-up time to continue standard system operation during an event with no input power and still allow execution of shutdown processes such as ADR or other housekeeping procedures that would prevent data corruption before system shut down.

In one example, a method for managing undervoltage in a compute system includes: detecting an AC undervoltage condition in the compute system; and upon detecting the AC undervoltage condition: dynamically determining a holdup time as a function of the present load; determining a monitoring period as a function of the dynamically determined holdup time; waiting for the determined monitoring period to expire; and upon expiration of the determined monitoring period, performing a shutdown process if the AC undervoltage condition persists.

In another example, a controller includes: a processing resource and a memory in communication with the processing resource and encoded with instructions. The instructions, when executed by the processing resource, perform a method including: detecting an AC undervoltage condition in the compute system; and upon detecting the AC undervoltage condition: dynamically determining a holdup time, including: determining a present load for a plurality of power supplies as a percentage of a rated load for the plurality of power supplies; ascertaining the holdup time for the compute system as a function of the present load; determining a monitoring period as a function of the dynamically determined holdup time; waiting for the determined monitoring period; and upon expiration of the determined monitoring period, performing a shutdown process if the AC undervoltage condition persists.

In yet another example, a compute system, includes: a plurality of computational nodes; a power subsystem receiving an alternating current ("AC") power input and including a plurality of power supplies providing power to the computational nodes; and a controller. The controller includes a processing resource and a memory. The memory is encoded with instructions that, when executed by the processing resource, perform a method including: detecting an AC undervoltage condition in the compute system; and upon detecting the AC undervoltage condition: dynamically determining a holdup time, including: determining a present load for a plurality of power supplies as a percentage of a rated load for the plurality of power supplies; ascertaining the holdup time for the compute system as a function of the present load; determining a monitoring period as a function of the determined holdup time; waiting for the determined monitoring period; and upon expiration of the determined monitoring period, performing a shutdown process if the AC undervoltage condition persists.

Some of the following discussion will use terminology and technology originating in the Common Redundant Power Supply ("CRPS") standard promulgated and used by Intel Corporation. However, this is for convenience in describing specific implementations of the subject matter claimed below in order to more fully convey that which is being claimed. Not all compute systems employ the CRPS standard, and the discussion herein of examples that do employ the CRPS standard is not intended as any kind of limitation on the claimed subject matter. The claimed subject matter may be implemented in examples that may or may not employ the CRPS standard.

Turning now to the drawings, FIG. 1 shows selected portions of an example compute system 100 in accordance with one or more embodiments. Those in the art having the benefit of this disclosure will appreciate that FIG. 1 is a high level schematic illustration and that an actual implementation will include additional detail and functionality. Such additional detail and functionality has been omitted for the sake of clarity and so as not to obscure the subject matter claimed below.

The compute system 100 receives an AC power input 101 from an external AC source 102 over a line 104. The external AC source 102 may ultimately be, for instance, the electrical grid or a backup generator. Typically, the compute system 100 will be located in a computing facility (not shown) receiving the AC power from the grid. The computing facility will then distribute the AC power to the compute system 100 as well as other items and entities in the computing facility that are consuming power.

The compute system 100 includes a plurality of PSUs 106 individually reference as $PSU_1$ to $PSU_N$. The PSUs 106 receive the external AC input power from the source 102 over the line 104, condition and convert it, and output DC output power over the lines 108 individually referenced as $108_1$ to $108_N$. The lines 108 may be a part of or include a power rail, a power cable, or a power bus implemented in, for instance, electrical leads depending upon the implementation.

The compute system 100 further includes a plurality of loads 110 individually referred to as $LOAD_1$ to $LOAD_M$. The number N of PSUs 106 may be less than, equal to, or greater than the number M of loads 110 depending on implementation-specific constraints. Similarly, the number of lines 108 need not necessarily be of the same number as the PSUs 106 or a different number from the loads 110. The number of lines 108 may be less than, equal to, or greater than the number of PSUs 106 and the number of loads 110.

The components of the compute system 100—e.g., the PSUs 106, loads 110, and controller 114—may be disposed within an enclosure or rack (not shown). The PSUs 106 may be a part of a larger power subsystem. The loads 110 may be essentially any kind of power consuming component of a compute system. The loads 110 may include, for instance, computational nodes such as computing nodes, storage nodes, or some combination thereof. The loads 110 may also include, for another instance, pumps or fans in a cooling subsystem. In some examples, the controller 114 may be a part of the power subsystem or, a part of some other subsystem, or distributed across various components of the compute system 100.

The PSUs 106 redundantly power the loads 110. The loads 110 draw the DC output power of the PSUs 106 over the lines 108. Note that the lines 108 are common by virtue of the conceptualized line 112 so that each of the loads 110 is powered by any or all of the PSUs 106. There may or may not be a line 112 or separate lines $108_1$ to $108_N$ in any given implementation so long as the PSUs 106 redundantly provide power to the loads 110. For instance, in some examples, the PSUs 106 may provide power onto a single power rail from which the loads 110 are all powered.

The compute system 100 still further includes a controller 114. The controller 114 communicates with the PSUs 106 over the lines 116 referred to individually as lines 1161 to 116N. In this particular example, the controller 114 also communicates with the loads 110 over a plurality of lines 118 referred to individually as lines $118_1$ to $118_M$, although the lines 118 may be omitted in some examples. The lines 116 and the lines 118 may be implemented in, for instance, printed circuit board ("PCB") traces, electrical lines, optical fibers, or some combination thereof. In various examples, the lines 116 and/or the lines 118 may be cabled. Each line 116, 118 may also comprise more than one individual PCB trace, electrical wire, or optical fiber. Note that, in some examples, the loads 110 may communicate with one another and/or the PSUs 106 over lines not shown.

Figure 2:
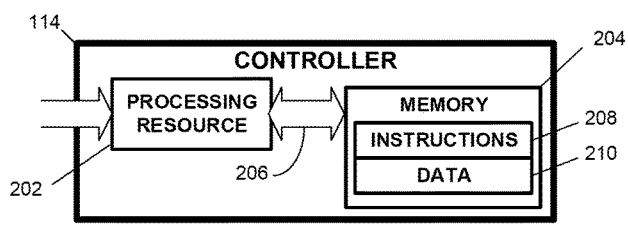
FIG. 2 schematically depicts one particular example of the controller in FIG. 1.

FIG. 2 depicts one particular example of the controller 114 in FIG. 1. In the illustrated example, the controller 114 includes a processing resource 202 and a memory 204 communicating over a bus 206. A set of instructions 208 reside on the memory 204 that, when executed by the processing resource 202, perform the functionality described more fully below. A set of data 210 also resides on the memory 204 in a data structure not separately shown. In one example discussed below, the data structure is a lookup table. The data includes certain operational information provided by the PSUs 106, shown in FIG. 1, upon which processing resource 202 operates when executing the instructions 208.

More particularly, the processing resource 202 may be, without limitation, a microcontroller, a microprocessor, a central processing unit ("CPU"), a processor chipset, a programmable system-on-chip ("PSOC"), integrated lights out ("iLO") controller, or an application specific integrated circuit ("ASIC"). The memory 204 may be random access memory ("RAM"), read only memory ("ROM"), an erasable programmable read-only memory (EPROM), or some combination thereof. Furthermore, although the controller 114 in the example of FIG. 2 is shown as a single processor-based unit, the computational functionality may be distributed across multiple processing resources and/or multiple memories. For instance, in some examples not shown, a portion of the data 210 is stored in a lookup table in ROM and a portion of the data is stored in RAM.

The data 210 in FIG. 2 pertains, at least in part, to the power supply capacity of the PSUs 106 in FIG. 1 as a function of load. More particularly, not all of the loads 110 will be active or drawing the same amount of power all the time during the operation of the compute system 100. Consequently, a different amount of the power supply capacity of the PSUs 106 will be used at any given time. This conversely means that the power supply capacity of the PSUs 106 available for shutdown operations in the event of an AC undervoltage condition will also vary over time.

The presently disclosed technique leverages this fact to dynamically determine a monitoring period and a holdup time that varies as a function of the load currently being experienced by the PSUs 106. Accordingly, the data 210 includes information for how long the PSUs 106 may operate at a given load. The load may be expressed as a percentage of the rated power supply capacity for the particular example. The data 202 may be stored in any suitable data structure and, in the examples illustrated herein, is stored in a lookup table (not yet shown).

In the illustrated examples, this information is predetermined and preloaded into the memory 204, shown in FIG. 2. The design of the compute system 100 will be known a priori, and so the identity of the PSUs 106 by manufacture and model will be known. The rated power capacity for each PSU 106 can be determined from the manufacture and model and, thus, the total power capacity of the PSUs 106 collectively can be determined. The total power capacity of the PSUs 106 may then be stored as a part of the data 210. During operation, the controller 114 will be able to ascertain the total current draw from, and present load on, the PSUs 106 and determine the percentage of the total power capacity consumed by the present load.

As noted above, the data 210 also includes information for how long the PSUs 106 may operate at a given load. The information may more particularly include information for how long the PSUs 106 can provide power in regulation as a function of the load. So, for instance, the PSUs 106 may provide in regulation power for X ms at a 10% load but for Y ms at a 20% load. This information may be provided with any desired granularity for any given example. Some examples may therefore provide this information for percentage load in 5 point increments, while others do so in 10 point increments, etc.

In the illustrated embodiments, the information described above as a part of the data 202 in FIG. 2 is predetermined and preloaded before the compute system 100 shown in FIG. 2 is placed into service. This decision may be governed by efficiency and because not all PSUs 106 are capable of providing the requisite information on the fly during operations. However, some PSUs 106 called "smart" PSUs are currently or soon will be capable of transmitting identifying information such as manufacturer and model number. Some examples not shown may therefore query or otherwise interact with the PSUs 106 whenever a PSU 106 is replaced or upon boot to determine the make and model of the PSUs 106 and then determine the information discussed above.

Figure 3:
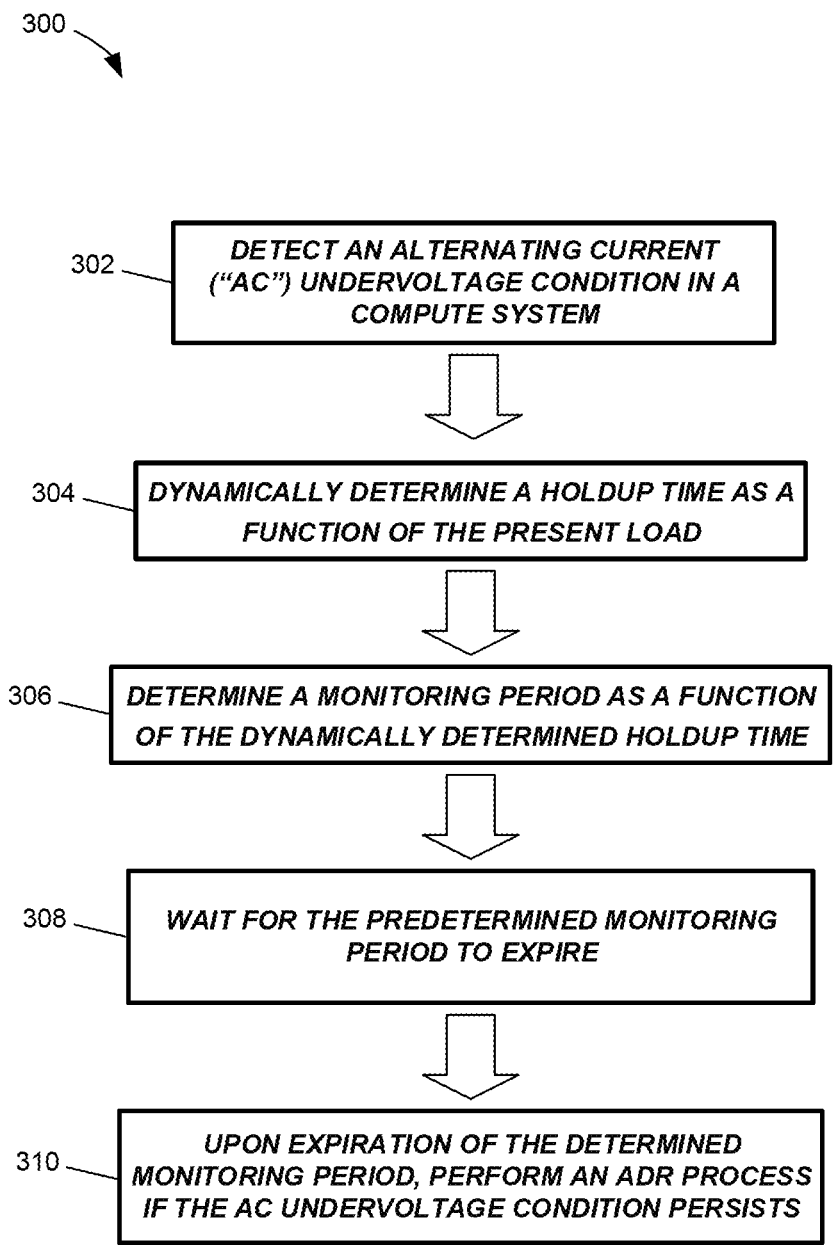
FIG. 3 illustrates one particular example of a method practiced in accordance with one or more embodiments.

Referring now collectively to FIG. 1-FIG. 3, the processing resource 202 of the controller 114 executes the instructions 208 to perform the method 300 of FIG. 3. The method 300 is a method for managing undervoltage in a compute system and begins with (at 302) detecting an AC undervoltage condition in the compute system 100. The AC undervoltage condition may be a loss of alternating current ("AC") input power, or an AC input power outside of regulation, or a loss of redundant power supply, or a combination thereof.

Figure 4:
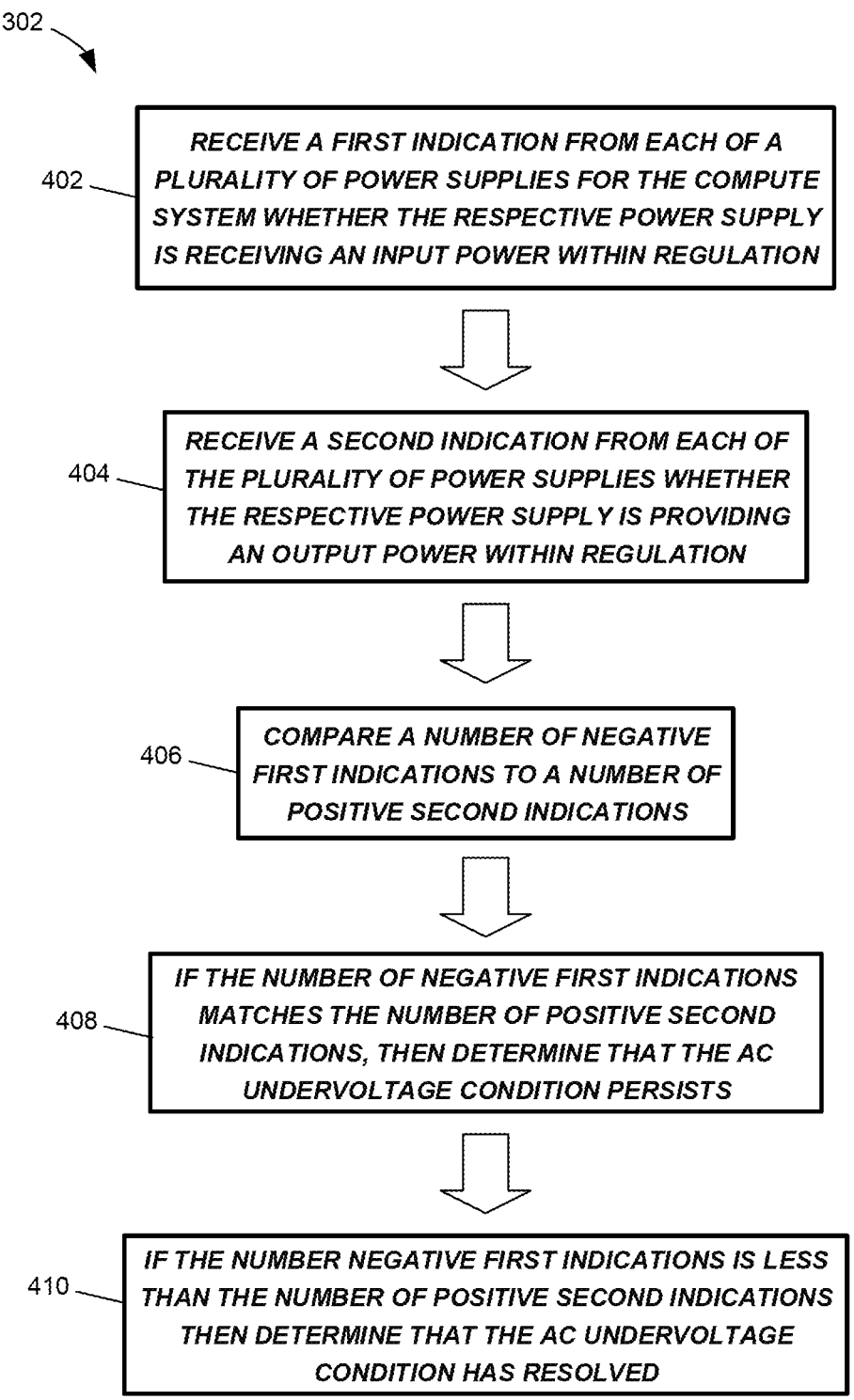
FIG. 4 illustrates how an alternating current ("AC") undervoltage condition may be detected in one particular example of FIG. 3.

In some examples wherein the AC undervoltage condition is a loss of AC input power, detecting the AC undervoltage condition (at 302) may include, as shown in FIG. 4, receiving (at 402) a first indication from each of a plurality of power supplies for the compute system whether the respective power supply is receiving an input power within regulation and receiving (at 404) a second indication from each of the plurality of power supplies whether the respective power supply is providing an output power within regulation. The controller 114 may receive the first and second indications over the lines 116 shown in FIG. 1. In examples complying with the CRPS standard, the first indications may be a plurality of $V_{IN\_GOOD}$ signals and the second indications may be a plurality of PWOK signals as defined by the CRPS standard.

The method then compares (at 406) the number of negative first indications to a number of positive second indications. If the number of negative first indications matches the number of positive second indications (at 408), then the method determines that the AC undervoltage condition persists. If the number negative first indications is less than the number of positive second indications (at 410), then the compute system 100, shown in FIG. 1, continues or returns to normal operations.

Returning to FIG. 3, upon detecting the AC undervoltage condition (at 302), the method 300 then dynamically determines (at 304) a holdup time as a function of the present load. The holdup time is "dynamically determined" in the sense that it is not predetermined or considered to be static. The holdup time is determined only after detection of the AC undervoltage condition because the load will fluctuate over time. Since the load determines the amount of draw on the power available for performing shutdown processes, it also affects the amount of time available for those shutdown processes. The desired holdup time will consequently fluctuate with the present load at the time the AC undervoltage condition occurs. Accordingly, the disclosed technique does not predetermine a static value, such as 6 ms, for the holdup time and instead dynamically determines it as a function of the load present at the time the AC undervoltage condition occurs.

Figure 5:
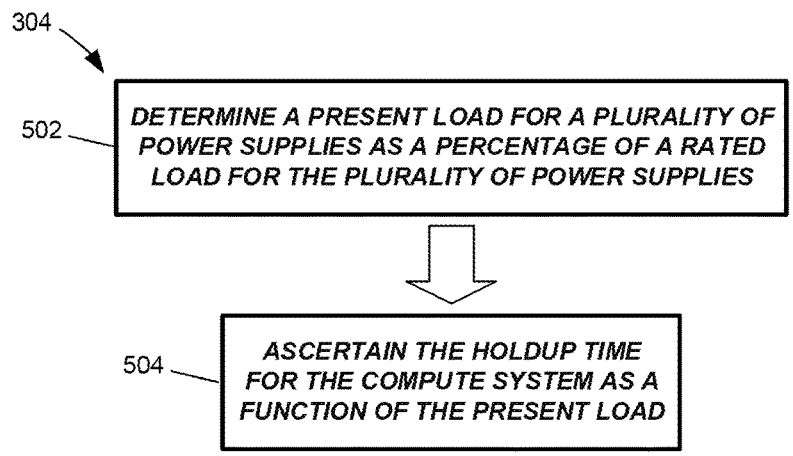
FIG. 5 illustrates dynamically determining the holdup time as a function of the present load in one particular example of FIG. 3.

As illustrated in FIG. 5, dynamically determining (at 304) the holdup time as a function of the present load may include determining (at 502) a present load for a plurality of power supplies as a percentage of a rated load for the plurality of power supplies. Determining the present load as the percentage of the rated load may include receiving a third indication from each of the plurality of power supplies of the percentage of the rated load powered by the respective power supply; and summing the third indications. These third indications may also be communicated from the PSUs 106 to the controller 114 over the lines 116 as shown in FIG. 1. In examples complying with the CRPS standard, these third indications may be ISHARE signals as defined by the CRPS standard.

Once the holdup time is dynamically determined (at 502), the method then ascertains (at 504) the holdup time for the compute system as a function of the present load. This may include accessing a stored lookup table including a plurality of entries for percentage of rated loads and a plurality of predetermined holdup times, each predetermined holdup time corresponding to a respective entry for percentage of rated loads as discussed above. The table may be predetermined and preloaded, also as discussed above.

Returning to FIG. 3, once the holdup time is dynamically determined (at 304), the method 300 continues by determining (at 306) a monitoring period as a function of the dynamically determined holdup time. The monitoring period provides an opportunity for the AC undervoltage condition to correct, thereby helping to obviate situations in which the compute system 100, shown in FIG. 1, unnecessarily performs a shutdown process. The determined monitoring period expires so that, upon its expiration, enough time remains to perform a shutdown process should the AC undervoltage condition persist. In one example discussed more fully below, the monitoring period is dynamically determined to be the dynamically determined holdup time less a response time for a first indication from each of a plurality of power supplies for the compute system whether the respective power supply is receiving an input power within regulation and less a period for performing the shutdown process.

The method 300 then waits (at 308) for the determined monitoring period to expire. This may include setting a timer to the determined monitoring period and waiting for the timer to indicate that the monitoring period has elapsed.

The method 300 then, upon expiration of the determined monitoring period (at 308), performs (at 310) a shutdown process if the AC undervoltage condition persists. In the examples illustrated herein, the shutdown process includes ADR, but other examples not shown may not. If the AC undervoltage condition resolves at some point prior to the expiration of the determined monitoring period, the compute system 100 resumes or continues normal operations, i.e., operations that would occur in the absence of the AC undervoltage condition.

Some examples may incorporate a power saving feature wherein selected processes may be throttled upon detection of the AC undervoltage condition. Such throttling may occur prior to determining the monitoring period, thereby lengthening the monitoring period. This throttling may decrease the computational efficiency of the computer system 100, however, and so some balance in which and how many processes are throttled may be desirable where throttling is practiced.

Figure 6:
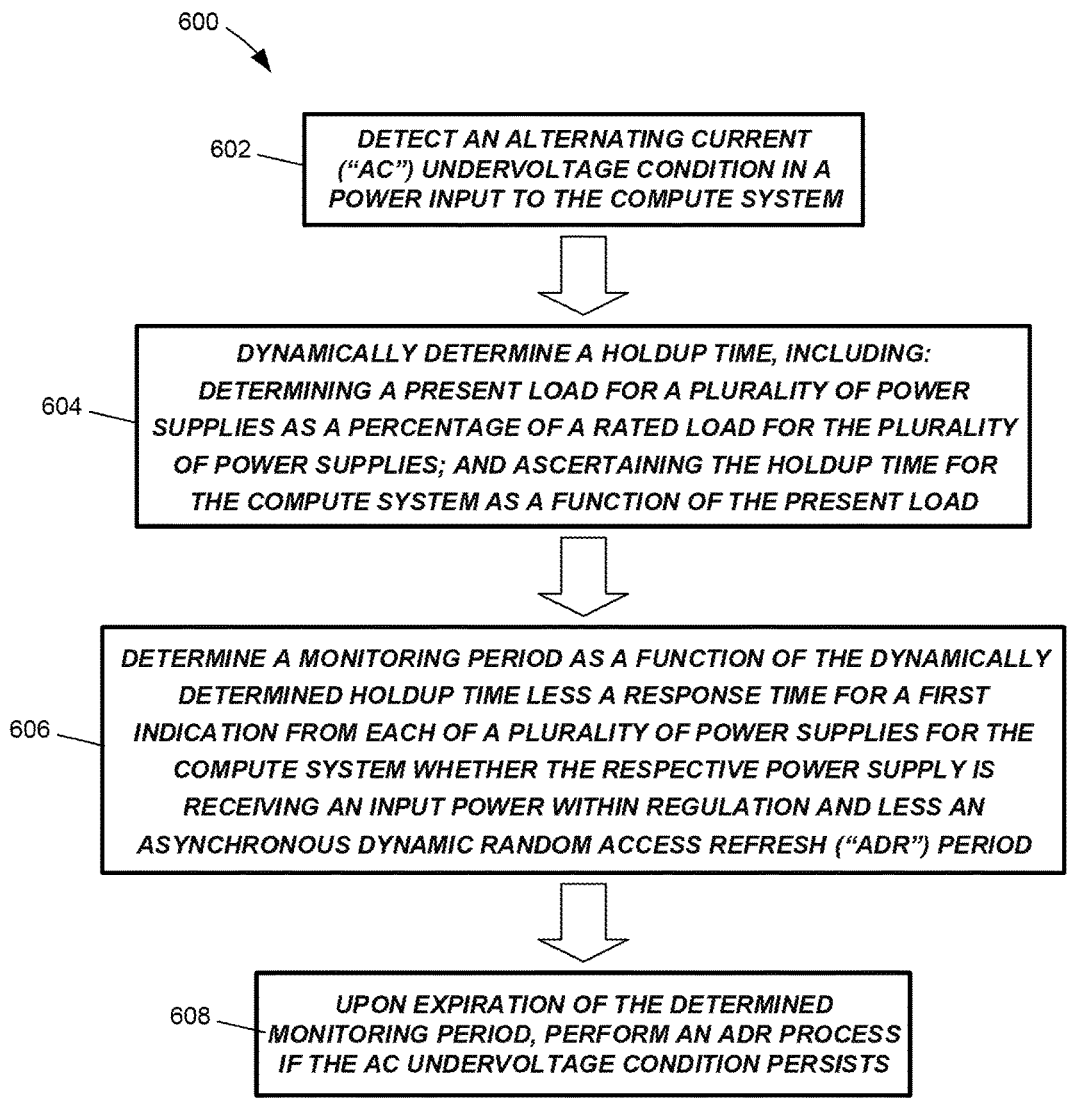
FIG. 6 illustrates one particular example of a method practiced in accordance with one or more embodiments.

FIG. 6 illustrates on particular example of a method practiced in accordance with one or more embodiments. In this example, a compute system, such as the compute system 100 in FIG. 1, is managing a loss of AC power, such as power from the AC source 102 in FIG. 1. Furthermore, in this example, the shutdown process includes an ADR.

The method 600 begins by detecting (at 602) an AC undervoltage condition in a power input to a computer system. The method 600 then dynamically determines (at 604) a holdup time. This includes determining a present load for a plurality of power supplies as a percentage of a rated load for the plurality of power supplies and ascertaining the holdup time for the compute system as a function of the present load.

The method 600 then determines (at 606) a monitoring period as a function of the dynamically determined holdup time less a response time for a first indication from each of a plurality of power supplies for the compute system whether the respective power supply is receiving an input power within regulation and less an ADR period. The method 600 then, upon expiration of the determined monitoring period performs (at block 608) an ADR process if the AC undervoltage condition persists.

Figure 7:
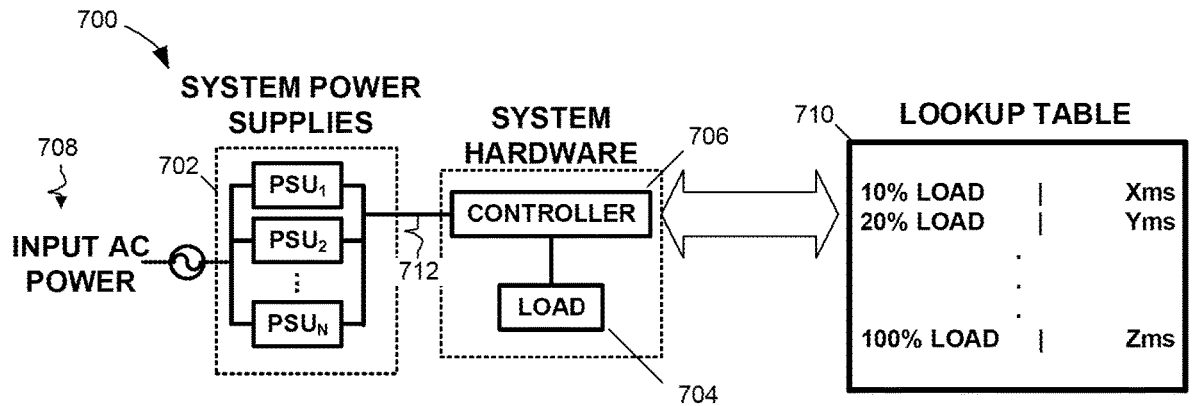
FIG. 7 schematically depicts selected portions of an example compute system in accordance with one or more embodiments.

Turning now to FIG. 7, selected portions an example compute system 700 in accordance with one or more embodiments are schematically shown. A compute system 700 includes a plurality of PSUs 702, a load 704, and a controller 706. The PSUs 702 may be individually referenced as $PSU_1$ to $PSU_N$. Each of the PSUs 702 are of the same manufacture and model in this example. The controller 706 may be implemented similarly to the controller 114 shown in FIG. 2.

Each PSU 702 will receive input power (e.g., input AC power 708) whether it be from individual or separate feeds. Each power supply $PSU_1$ to $PSU_N$ will provide a set of control signals to the read by the controller 706 over, for instance, the line(s) 712. The controller 706 will also interface the defined lookup table 710 that will be used for determining timing values as described below. The other system hardware devices, such as CPUs, NVDIMMs, DIMMs, etc., none of which are shown, may also communicate with the controller 706.

Figure 8:
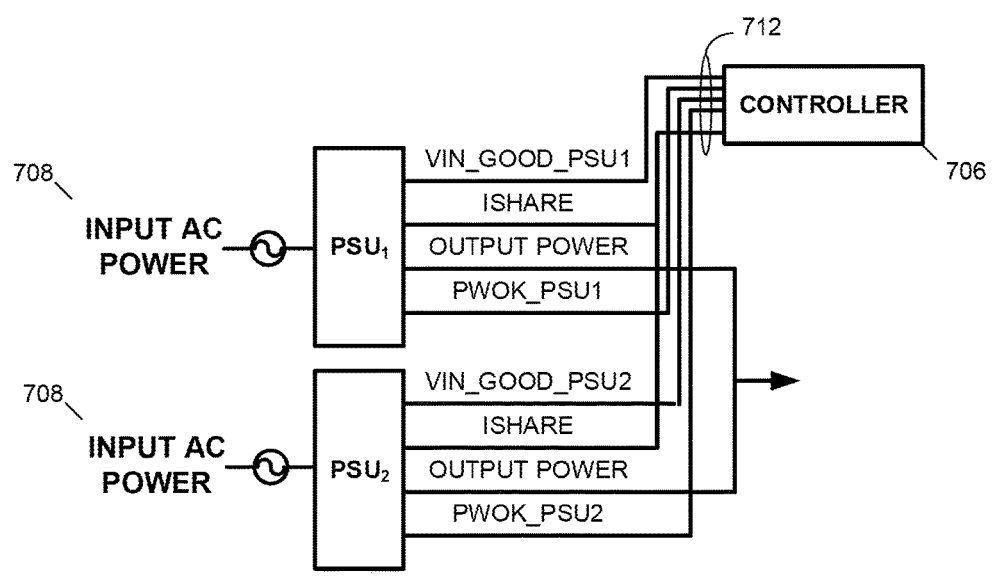
FIG. 8 illustrates some of the signals output by the power supply units and read by the controller of FIG. 7 to implement the functionality in one particular example.

FIG. 8 illustrates some of the signals output by the PSUs 106 and read by the controller 706 to implement the functionality described below. FIG. 8 only includes $PSU_1$ and $PSU_2$ for the sake of clarity, but the discussion pertains to all PSUs 702. The compute system 700 complies with the CRPS standard and utilizes a number of signals defined therein, including VIN_GOOD, ISHARE, and PWOK. VIN_ GOOD asserts high when input AC voltage is within regulation (in the illustrated example, within 1 ms) and will de-assert when input voltage is out of regulation (in the illustrated example, within 2 ms). ISHARE is a DC signal that proportionally represents the percent load current that a power supply is providing. Example levels are such as: 8.0V=100% load, 4.0V=50% load, 0.8V=10% load. PWOK asserts high when output voltage is within regulation and de-assert when output voltage falls out of regulation or when power supply operation is no longer guaranteed.

Returning to FIG. 7, the controller 706 includes a memory (not shown) in which a lookup table 710 is preloaded with predetermined information regarding holdup times for the compute system 700 as a function of load. The load is expressed as a percentage of the maximum rated power capacity for the PSUs 702. In one particular example, with a maximum rated capacity of a 2400 W and a maximum output current of 196.7 A. The compute system 700 may then be operated with varying loads 704 to gather the information for the lookup table 710.

The lookup table 710 might look something like Table 1 below when rendered for human perception. The granularity of the information to be referenced is as high as may be determined desirable for a given level of performance for the compute system 700. The data could have been gathered in 5% increments, for example. The information could also, instead of being referenced in a look-up table, be referenced in a formula that would allow the system to calculate an estimated hold-up time amount by inputting a specific output current.

TABLE 1

Percent Load Hold-up Time Reference Table (for example only)

| Percent Load | Output Current (A) | Hold-up Time (ms) |
|---|---|---|
| 40% | 78.76 | 36.765 |
| 60% | 118.00 | 25.834 |
| 80% | 157.30 | 20.270 |
| 100% | 196.68 | 17.132 |

Once the described above data is known, tabulated, and loaded, the compute system 700 can then implement a process that will now be described and that references the data. At some point during operations, AC input power 706 is lost and input voltage drops to 0 VAC. No system reaction is possible at this point. Each PSU 702 detects that the input voltage 708 is out of regulation and de-asserts the VIN_GOOD signal shown in FIG. 8. For this example, the state change is specified to occur within 2 ms.

The compute system 100, through the controller 706, reacts to this state change and compares of the quantity of de-asserted VIN_GOOD signal(s) to the number of PWOK signal(s), both of which are shown in FIG. 8. This will determine if any of the PSUs 702 are still powered on to take on the system load 704 when the PSUs 702 that lost input power are shut down. If the quantity of low (de-asserted) VIN_GOOD signals matches the quantity of high (asserted) PWOK signals, then the controller 706 will start a timer counting up from 0, which will keep track of current elapsed time. Otherwise, if the quantity of low VIN_GOOD signals is less than the quantity of high PWOK signals, then the controller 706 has at least one PSU 702 that is available to power the system, and the system can return to normal operation.

The controller 706 then determines power supply load level as a percentage of load capacity via the ISHARE signal shown in FIG. 8. This value is then referenced to the closest value (rounded up) within the reference table—i.e., lookup table 710, which may be Table 1 above. If the ISHARE signal is reading, for instance, 4.163V, this equates to a present load that is 51.7% of the rated load. The referenced value in the table then would be 60% load, giving a hold-up time of 25.834 ms. (In some examples, this value could be rounded down to the appropriate amount of significant figures for the controller 706 to calculate from.)

The monitoring period is the total time allowed before determination is made whether the AC undervoltage condition persists. The monitoring period is calculated from known requirements along with our estimated hold-up time:

Monitoring period=(holdup time at reference load %)−(VIN_GOOD response time)−(ADR timing requirements), =25.834 ms−2.000 ms−6.000 ms=17.834 ms      Eq. (1)

As discussed above, the controller 706 may optionally throttle selected processes. The controller 706 then waits until the previously set timer reaches this calculated total time value, or there is a state change in VIN_GOOD. When monitoring period elapses per the timer, or when a stage change has occurred, the controller 706 then reads the state of each VIN_GOOD.

If a respective VIN_GOOD is high (has been re-asserted), then AC input power 708 to the respective PSU 702 is back within regulation. The controller 706 now would stop any throttling (if implemented) and the compute system 700 returns to normal operation. If VIN_GOOD is still low (such as in this example scenario), then the system begins the shutdown processes including at least ADR. The compute system 700 completes the ADR process within the specified 6 ms and then shuts down due to the power supply output voltage being out of regulation.

Thus, in this example, a dynamic timing technique is proposed to allow a compute system to react to AC undervoltage or loss of input power and only react with shutdown processes (including ADR) after a maximum hold-up time has elapsed. This method would reference information provided by or about the system AC/DC power supplies that will detect when there is no AC voltage on the input of the power supplies or other under-voltage condition, and the output load level the power supplies are providing. The latter information can then be used in a lookup table function, which is built upon information characterized by the amount of hold-up time the power supplies can provide at the known load level. This would tell the system a maximum hold-up time to continue standard system operation during an event with no input power and still allow execution of shutdown processes such as ADR or other housekeeping procedures that would prevent data corruption before system shut down.

The disclosed technique therefore maximizes or increases ride-through capabilities during brown-out events. Without this technique, a compute system would shut down earlier than necessary in order to be sure shut down processes are executed with proper time remaining. The disclosed technique therefore helps maintain compute systems to continue standard operations while mitigating potential ways for system failure.

The phrase "capable of" as used herein is a recognition of the fact that some functions described for the various parts of the disclosed apparatus are performed only when the apparatus is powered and/or in operation. Those in the art having the benefit of this disclosure will appreciate that the embodiments illustrated herein include a number of electronic or electro-mechanical parts that, to operate, require electrical power. Even when provided with power, some functions described herein only occur when in operation or only occasionally during operation. Thus, at times, some embodiments of the apparatus of the invention are "capable of" performing the recited functions even when they are not actually performing them—i.e., when there is no power or when they are powered but not in operation.

This concludes the detailed description. The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for managing undervoltage in a compute system, comprising:

detecting an alternating current ("AC") undervoltage condition in the compute system by receiving a first indication from each of a plurality of power supplies for the compute system whether the respective power supply is receiving an input power within regulation;

receiving a second indication from each of the plurality of power supplies whether the respective power supply is providing an output power within regulation;

comparing a number of negative first indications to a number of positive second indications;

if the number of negative first indications matches the number of positive second indications, then determining that the AC undervoltage condition persists; and if the number of negative first indications is less than the number of positive second indications, then determining that the AC undervoltage condition has resolved; and in response to detecting the AC undervoltage condition:

dynamically determining a holdup time as a function of the present load of the compute system;

determining a monitoring period as a function of the dynamically determined holdup time;

waiting for the determined monitoring period to expire; and in response to expiration of the determined monitoring period, perform a shutdown process if the AC undervoltage condition persists.

2. The method of claim 1, wherein:

dynamically determining the holdup time as the function of the present load includes dynamically determining a holdup time for an asynchronous dynamic random access memory refresh ("ADR") as a function of the present load; and performing the shutdown process includes performing an ADR.

3. The method of claim 1, wherein the present load comprises the amount of power presently being drawn from the plurality of power supplies characterized as a percentage of a rated load for the plurality of power supplies; and wherein dynamically determining the holdup time as a function of the present load includes ascertaining the holdup time for the compute system as a function of the present load.

4. The method of claim 3, wherein determining the present load characterized as the percentage of the rated load includes:

receiving a load indication from each of the plurality of power supplies indicative of the amount of power presently being drawn from the respective power supply characterized as a percentage of the rated load of the plurality of power supplies; and summing the load indications.

5. The method of claim 1, wherein determining the monitoring period as a function of the dynamically determined holdup time includes determining the monitoring period as the dynamically determined holdup time less a response time for a first indication from each of a plurality of power supplies for the compute system whether the respective power supply is receiving an input power within regulation and less a period for performing the shutdown process.

6. The method of claim 1, further comprising:
throttling selected operations of the compute system; and
wherein:
  determining the monitoring period as a function of the dynamically determined holdup time includes dynamically determining the monitoring period as a function of the dynamically determined holdup time after throttling the selected operations.

7. The method of claim 1, further comprising:
monitoring the AC undervoltage condition; and
continuing or returning to normal operations if the AC undervoltage condition is resolved prior to expiration of the determined monitoring period.

8. The method of claim 1, further comprising, in response to expiration of the determined monitoring period, continuing or returning to normal operations if the AC undervoltage condition is resolved.

9. A controller, comprising:
a processing resource; and
a memory in communication with the processing resource and encoded with instructions that, when executed by the processing resource, perform a method including:
  detecting an alternating current ("AC") undervoltage condition in a compute system by
    receiving a first indication from each of a plurality of power supplies for the compute system whether the respective power supply is receiving an input power within regulation;
    receiving a second indication from each of the plurality of power supplies whether the respective power supply is providing an output power within regulation;
    comparing the number of negative first indications to the number of positive second indications;
    if a number of negative first indications matches a number of positive second indications, then determining that the AC undervoltage condition persists; and
    if the number negative first indications is less than the number of positive second indications, then determining that the AC undervoltage condition has resolved; and
  in response to detecting the AC undervoltage condition:
    dynamically determining a holdup time, including:
      determining a present load for the plurality of power supplies, the present load comprising the amount of power presently being drawn from the plurality of power supplies characterized as a percentage of a rated load for the plurality of power supplies;
      ascertaining the holdup time for the compute system as a function of the present load;
      determining a monitoring period as a function of the dynamically determined holdup time;
    waiting for the determined monitoring period; and
    in response to expiration of the determined monitoring period, performing a shutdown process if the AC undervoltage condition persists.

10. The controller of claim 9, wherein:
determining the monitoring period as the function of the dynamically determined holdup time includes determining the monitoring period as a function of the determined holdup less a response time for a first indication from each of a plurality of power supplies for the compute system whether the respective power supply is receiving an input power within regulation and less an asynchronous dynamic random access refresh ("ADR") period; and
performing the shutdown process if the AC undervoltage condition persists includes performing an ADR.

11. The controller of claim 9, wherein determining the present load characterized as the percentage of the rated load includes:
receiving a load indication from each of the plurality of power supplies indicative of the amount of power presently being drawn from the respective power supply characterized as a of the percentage of the rated load of the plurality of power supplies; and
summing the load indications.

12. The controller of claim 9, further comprising:
monitoring the AC undervoltage condition; and
continuing or returning to normal operations if the AC undervoltage condition is resolved prior to expiration of the determined monitoring period.

13. The controller of claim 9, further comprising in response to expiration of the determined monitoring period continuing or returning to normal operations if the AC undervoltage condition is resolved.

14. A compute system, comprising:
a plurality of computational nodes;
a power subsystem receiving an alternating current ("AC") power input and including a plurality of power supplies providing power to the computational nodes; and
a controller including:
  a processing resource; and
  a memory encoded with instructions that, when executed by the processing resource, perform a method including:
    detecting an AC undervoltage condition in the compute system by
      receiving a first indication from each of a plurality of power supplies for the compute system whether the respective power supply is receiving an input power within regulation;
      receiving a second indication from each of the plurality of power supplies whether the respective power supply is providing an output power within regulation;
      comparing the number of negative first indications to the number of positive second indications;
      if a number of negative first indications matches a number of positive second indications, then determining that the AC undervoltage condition persists; and
      if the number of negative first indications is less than the number of positive second indications, then determining that the AC undervoltage condition has resolved; and
    in response to detecting the AC undervoltage condition:
      dynamically determining a holdup time, including:
        determining a present load for a plurality of power supplies, the present load comprising the amount of power presently being drawn from the plurality of power supplies characterized as a percentage of a rated load for the plurality of power supplies;
        ascertaining the holdup time for the compute system as a function of the present load;
      determining a monitoring period as a function of the determined holdup time;
      waiting for the determined monitoring period; and in response to expiration of the determined monitoring period, perform a shutdown process if the AC undervoltage condition persists.

15. The compute system of claim 14, wherein:
determining the monitoring period as the function of the dynamically determined holdup time includes determining the monitoring period as a function of the determined holdup less a response time for a first indication from each of a plurality of power supplies for the compute system whether the respective power supply is receiving an input power within regulation and less an asynchronous dynamic random access refresh ("ADR") period; and
performing the shutdown process if the AC undervoltage condition persists includes performing an ADR.

16. The compute system of claim 14, wherein determining the present load characterized as the percentage of the rated load includes:
receiving a load indication from each of the plurality of power supplies indicative of the amount of power presently being drawn from the respective power supply characterized as a percentage of the rated load of the plurality of power supplies; and
summing the load indications.

17. The compute system of claim 14, further comprising:
monitoring the AC undervoltage condition; and
continuing or returning to normal operations if the AC undervoltage condition is resolved prior to expiration of the determined monitoring period.

* * * * *